US010281258B2

(12) United States Patent
Farah

(10) Patent No.: US 10,281,258 B2
(45) Date of Patent: *May 7, 2019

(54) LENSLESS IMAGING WITH REDUCED APERTURE

(71) Applicant: John Farah, Attleboro, MA (US)

(72) Inventor: John Farah, Attleboro, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/169,629

(22) Filed: May 31, 2016

(65) Prior Publication Data

US 2016/0305773 A1 Oct. 20, 2016

Related U.S. Application Data

(63) Continuation-in-part of application No. 14/245,918, filed on Apr. 4, 2014, now Pat. No. 9,354,037, which is a continuation of application No. 13/764,592, filed on Feb. 11, 2013, now Pat. No. 8,693,001, which is a continuation of application No. 12/380,586, filed on Mar. 2, 2009, now Pat. No. 8,379,214, which is a continuation of application No. 11/331,400, filed on Jan. 12, 2006, now Pat. No. 7,499,174.

(60) Provisional application No. 60/643,327, filed on Jan. 12, 2005.

(51) Int. Cl.
*G01B 9/02* (2006.01)
*G03F 7/20* (2006.01)

(52) U.S. Cl.
CPC ..... *G01B 9/02098* (2013.01); *G01B 9/02084* (2013.01); *G03F 7/70408* (2013.01)

(58) Field of Classification Search
CPC ............ G01B 9/02098; G01B 9/02084; G01B 9/70408; G01B 9/02034; G01B 9/02047; G01B 9/06; G02B 23/02
USPC ....................................................... 356/450
See application file for complete search history.

(56) References Cited

U.S. PATENT DOCUMENTS

| 4,662,750 A * | 5/1987 | Barger ............... G01B 9/02032 356/510 |
| 2004/0051878 A1 * | 3/2004 | Rhoads .............. G02B 17/0663 356/521 |

* cited by examiner

*Primary Examiner* — Tarifur R Chowdhury
*Assistant Examiner* — Jonathon Cook

(57) ABSTRACT

An image of an object can be synthesized either from the Fourier components of the electric field or from the Fourier components of the intensity distribution. Imaging with a lens is equivalent to assembling the Fourier components of the electric field in the image plane. This invention provides a method and a means for lensless imaging by assembling the Fourier components of the intensity distribution and combining them to form the image with the use of amplitude splitting interferometer. The angular spectrum of the electromagnetic radiation consists of wavefronts propagating at different angles. The amplitude of each wavefront is split and interfered with itself to create sinusoidal fringe patterns having different spatial frequencies. The sinusoidal fringe patterns are combined to form an image of the object. This method applies to coherent and incoherent light. A method of measuring the angular spectrum $I(\theta_x,\theta_y)$ of an object, i.e. the intensity of the wavefront vs angle of incidence. An optical rotation sensor comprising an interferometer and a light source wherein the whole interferometer turns as a unit relative to the light source.

1 Claim, 7 Drawing Sheets

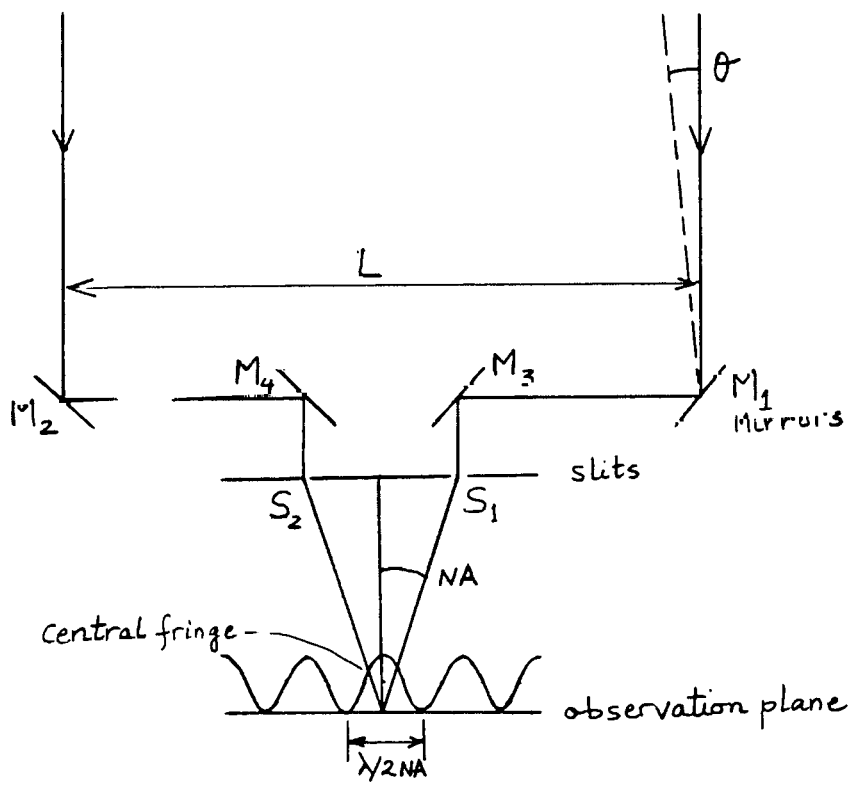

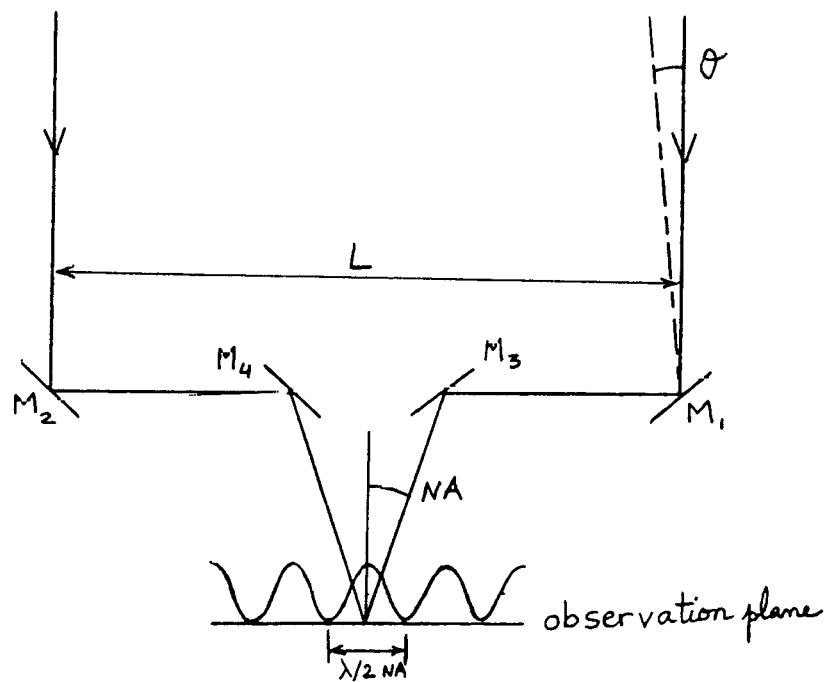
Fig. 2. Erect Shear Interferometer
Period of fringes does not vary with θ

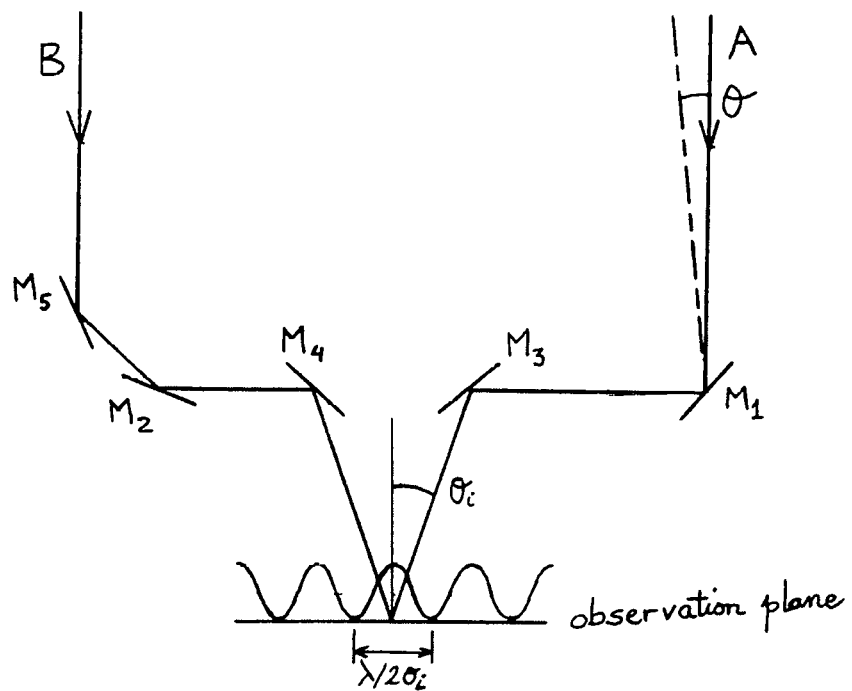
Fig. 3. Inverted Shear Interferometer
Period of fringes varies with $\theta$

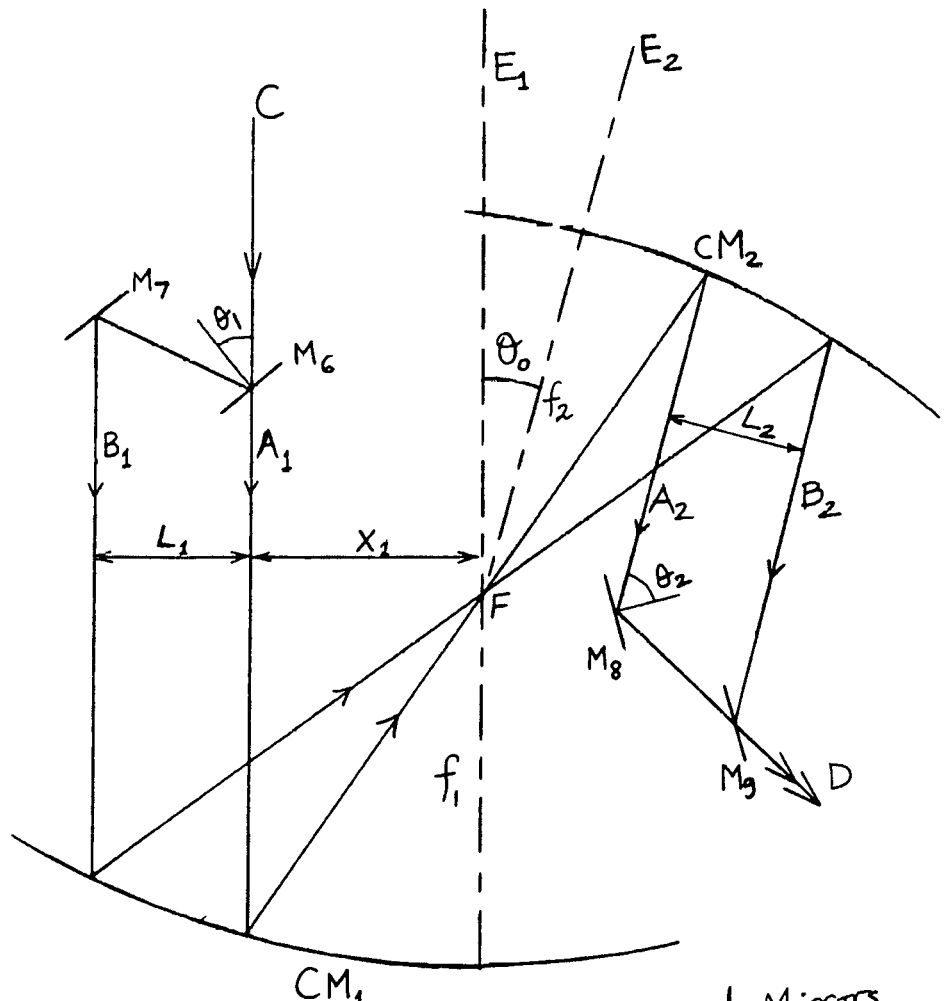
Fig. 4. Interferometer using two curved Mirrors Merged incident wavefront C

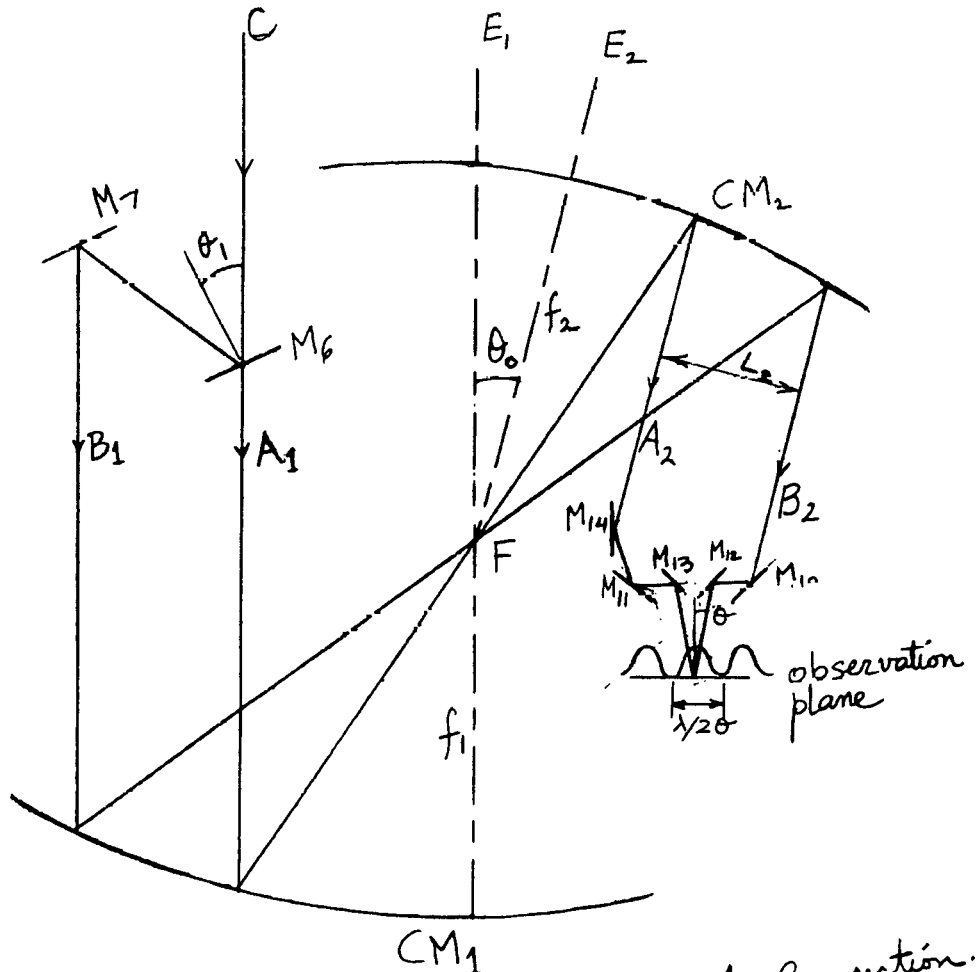
Fig. 5. Interferometer with reduced Crossection.

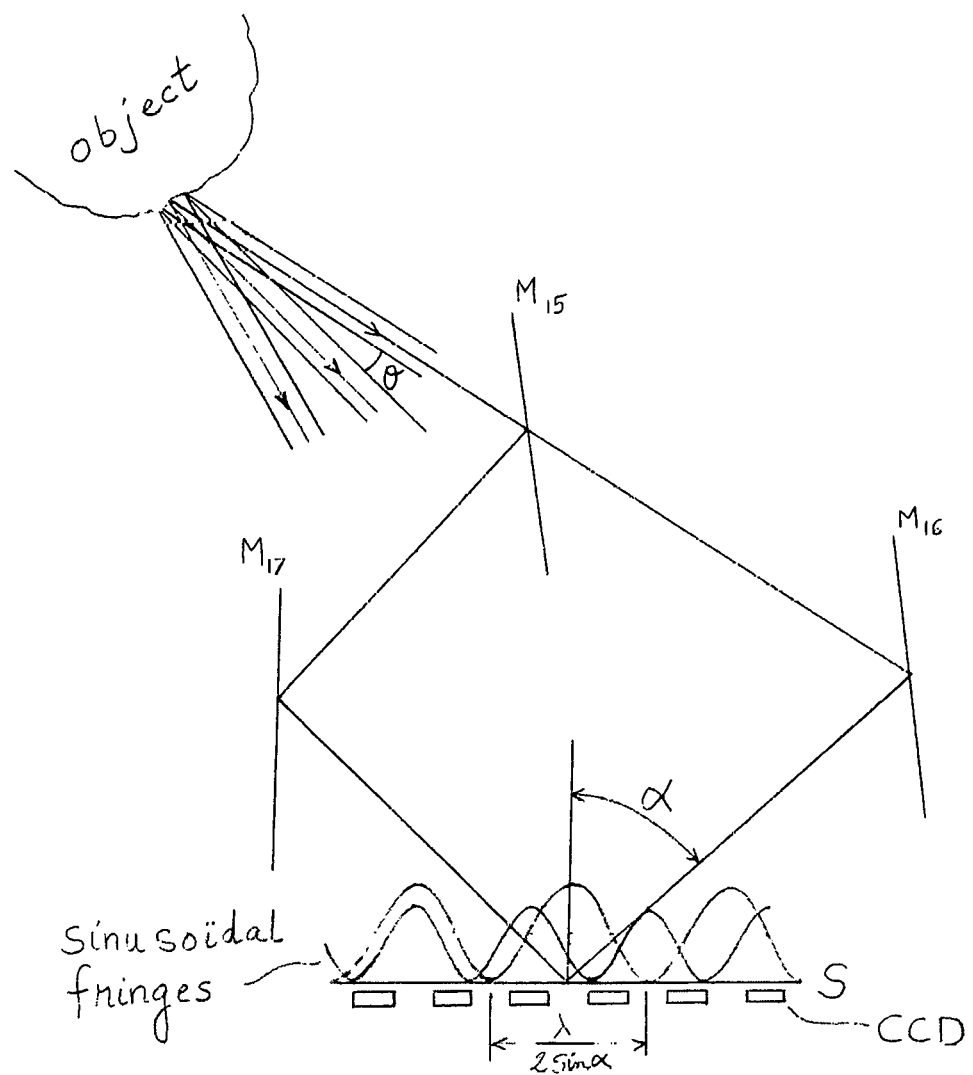
Fig. 6 Amplitude Splitting Imaging Interferometer

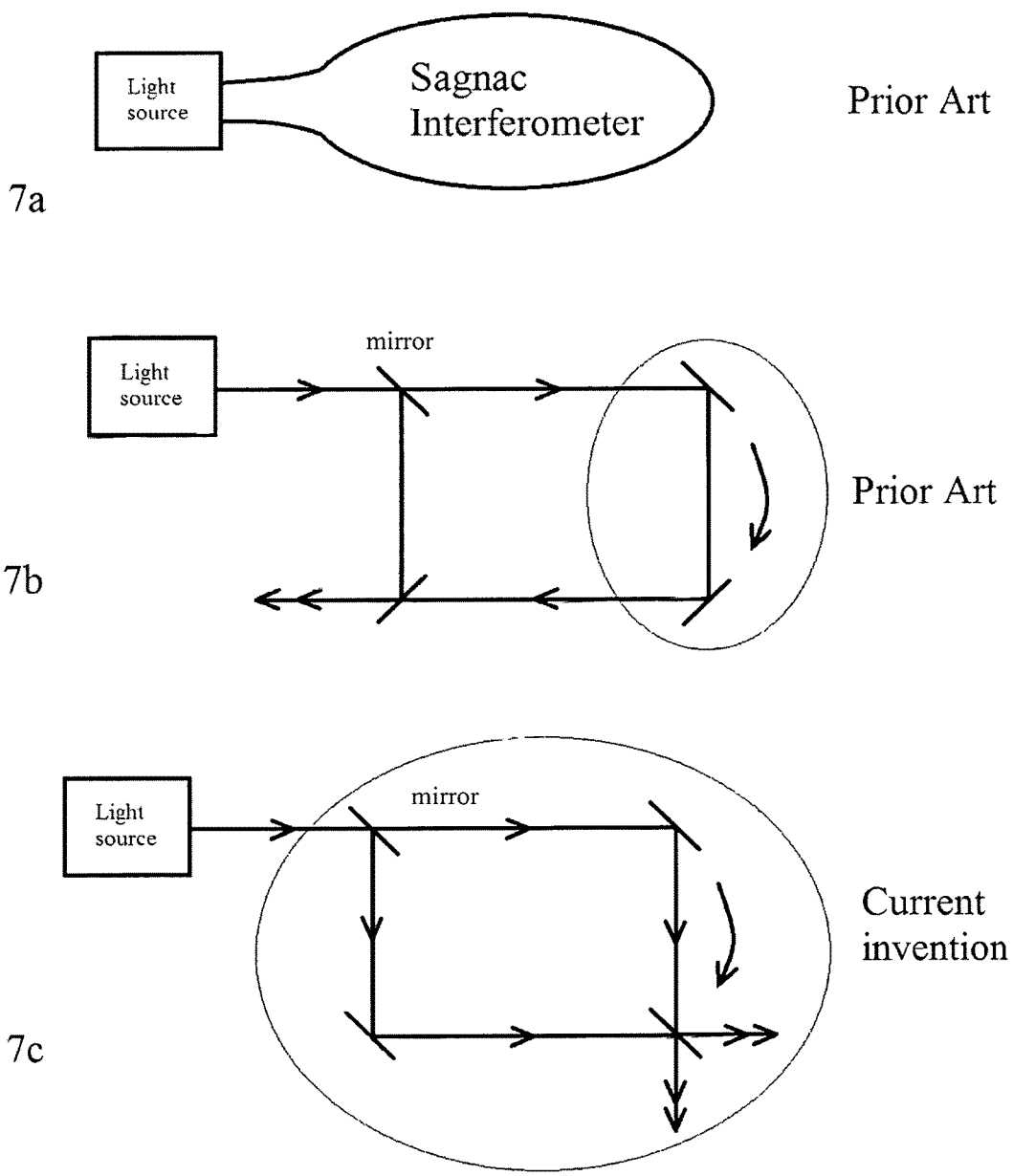
Fig. 7. Rotation sensor

LENSLESS IMAGING WITH REDUCED APERTURE

RELATED APPLICATIONS

This application is a continuation in part of U.S. application Ser. No. 14/245,918 filed on Apr. 4, 2014 which is a continuation of U.S. application Ser. No. 13/764,592 filed on Feb. 11, 2013 which is a continuation of U.S. application Ser. No. 12/380,586 filed on Mar. 2, 2009 which is a continuation of U.S. application Ser. No. 11/331,400 filed on Jan. 12, 2006 which claims priority under 35 U.S.C. § 119(e) to U.S. Provisional Application Ser. No. 60/643,327 entitled "Interferometric Imaging With Reduced Aperture," filed on Jan. 12, 2005, which is herein incorporated by reference in its entirety.

BACKGROUND OF THE INVENTION

1. Field of the Invention

This invention concerns reducing the cost and enhancing the resolution of optical imaging systems. This invention relates to imaging interferometers that create an image of a laterally extended object.

2. Discussion of Related Art

There are two kinds of imaging systems, those that form an image directly and those that synthesize the image from its Fourier components. When an object is illuminated with electromagnetic radiation it creates a diffraction pattern. If the radiation is spatially coherent, then the diffraction consists of a summation of plane waves diverging away from the object each representing one spatial frequency component of the electric field distribution on the object. The angle of diffraction of a particular wave is equal to the spatial frequency times the wavelength of light. Each one of these waves has amplitude and phase associated with it. On a screen in the far field, the diffraction produces an irradiance pattern, which is identical to the magnitude squared of the Fourier Transform of the electric field leaving the object. The phase information is lost. On the other hand if the body is illuminated with incoherent radiation or if it is self luminous, such as distant stars, then the illumination is uniform but the degree of coherence in the aperture plane is given by the Fourier Transform of the irradiance distribution on the object, according to the van Cittert-Zernike theorem, which is used extensively in astronomy.

Conventional imaging systems, such as a lens or holography, aim at capturing and recombining most of the waves that are diffracted from the object in order to construct the image. In principle, if all the divergent waves are redirected to intersect and overlap over some region of space while maintaining their original amplitudes, relative phases and angles then they would recreate a perfect image of the object. The failure of such systems to reproduce a perfect image is mainly due to the inability to capture the high frequencies, besides imperfections in the quality of the optical surfaces. In fact, image formation is an interferometric process. A lens is capable of forming an image of a coherent as well as an incoherent object because it has the property that all the rays and waves travel equal optical paths between the object plane and image plane. Thus, it does not matter what the coherence length is, the lens will form an image on-axis because the optical path length difference there is zero. The interference takes place over the entire image space and not just on-axis. At off-axis points in the image plane the path length difference changes gradually. Thus, the ability to interfere completely off-axis depends on the degree of coherence among the waves. The absence of the high frequency waves in finite aperture imaging systems creates artifacts in the image plane, which account for the degradation of the performance of coherent imaging systems. By contrast, the lack of coherence smoothes out the off-axis intensity variations in incoherent systems.

It is desired to broaden the aperture of imaging systems in order to enhance the imaging resolution. It is also desired to capture more photons from dim or rapidly varying sources to improve the signal to noise ratio. An increase in the size of the aperture of a lens or primary parabolic mirror is impractical beyond a certain limit because the cost of fabrication of large focusing elements to optical tolerances becomes prohibitive. Holographic imaging techniques replace the lens with a holographically fabricated grating. The phase of the first diffracted order from the holographic grating varies as the quadratic of the distance off-axis. This is analogous to the phase incurred by a ray traversing a lens, which varies quadratically with the radial position of the ray. A holographically fabricated grating preserves the phase and angle relationships among the diffracted waves similar to a lens, which allows it to reproduce the image with fidelity during reconstruction. A holographic grating accomplishes by diffraction what a lens does by refraction.

Conventional imaging systems utilize a focusing element, such as lens or parabolic mirror at full aperture to image distant objects in the focal plane. The focused image is susceptible to atmospheric aberrations and to imperfections of the optical surface. In order to reduce the effect of aberrations, it is desired to defocus or spread the light in the image plane. This can be accomplished by restricting the aperture, i.e. the use of synthetic aperture techniques and non-focusing optical elements, such as planar mirrors.

Coherent Imaging

The imaging of a coherent object can be achieved using a conventional full-aperture system, such as a lens or hologram. The electric fields of the diffracted waves add in amplitude and phase when recombined in the image plane. This produces a replica of the object if the amplitude, phase and angle relationships among the waves are preserved. It is not necessary in conventional imaging systems to know or measure the magnitude or phase of the electric fields. As long as the amplitude, phase and angle relationships, corresponding to the magnification of the imaging system, are preserved then the optical system will reconstruct the object with high fidelity. The burden of conventional systems is capturing the high frequency components of the diffracted waves to achieve a more complete interference. This requires bigger apertures, which increase the cost of the system significantly. Coherent imaging systems used in photolithography for the fabrication of electronic circuits aim to achieve sub-wavelength resolution. The resolution of conventional imaging systems is limited to $\lambda/2$ where $\lambda$ is the wavelength of light.

Synthetic Aperture

Unconventional systems attempt to create the effect of a large aperture synthetically by sampling a subset of the diffracted waves with the use of two or more sub-apertures. Since imaging along two axes is usually desired and to limit the displacement of each sub-aperture, several sparsely-located sub-apertures are deployed in the pupil plane. The basic technique entails the use of two very narrow apertures, e.g. pinholes as in Young's experiment, so that the diffraction effects become dominant. If the pinholes are placed in the far field of a coherently illuminated object, then each pin hole intercepts only one diffracted wave from the object. If the object is placed on the optical axis then the two pinholes capture the conjugate positive and negative frequencies of its Fourier Transform, i.e. the waves traveling symmetrically off-axis. The goal is to measure the amplitude and phase of the spatial frequency components of the field by mapping its Fourier Transform in the frequency domain. The diffraction from the pinholes creates sinusoidal fringes in the image plane. The spatial frequency of the fringes is determined by the spacing between the pinholes. The visibility of the fringes depends on the ratio of the amplitudes of the two interfering waves and the phase of the fringes represents the difference between the phases of the Fourier components. Unequal amplitudes cause a decrease in visibility or modulation of the fringes. A phase difference between the waves causes a shift of the central fringe off-axis. By varying the spacing between the holes the entire spatial spectrum of the object can be measured. It is worth noting that for a coherently illuminated object of arbitrary shape the Fourier Transform is not necessarily an even function, i.e. the magnitudes and phases of the conjugate positive and negative frequencies can differ. The object is subsequently reconstructed in the spatial domain by inverse Fourier transforming the data. Thus, synthetic aperture techniques inevitably involve computation in a two step process. Similarly, holography performs image reconstruction is a two step process, namely the write and read cycles. For this reason holography is not considered to be a real-time process. Nevertheless, the processing times can be shortened. This adds delay in the processing of the image, which becomes a concern especially for moving targets.

Incoherent Imaging

In the case of an incoherently illuminated or a self luminous object the magnitude and phase of the electric field cannot be uniquely defined. The irradiance in the aperture plane is uniform and the coherence function is given by the Fourier Transform of the irradiance of the object according to the van Cittert-Zernike theorem. Thus, the degradation in the visibility of the fringes is due to the lack of perfect coherence due to the diffraction from the pinholes of all the incident waves. The complex visibility of the central fringe, which is measured experimentally, is equal to the coherence function. The envelope of the fringes decays due to the finite coherence length of the light source and due to diffraction from the finite-width apertures. Thus, by varying the spacing between the apertures the entire spatial spectrum of the irradiance of the object can be mapped in the frequency domain, which is then inverted to obtain the irradiance distribution in the spatial domain, i.e. the image. Synthetic aperture techniques are known as Fourier imaging because the Fourier Transform of the image, rather than the image itself is obtained, which requires further computation to derive the image. By contrast, the full aperture lens and hologram are direct imaging techniques because the overlapping waves construct the image directly.

In either coherent or incoherent imaging it would be necessary to increase the size of the aperture in order to improve the imaging resolution. Since a Fourier Transform relationship exists between the object plane and the pupil plane, the resolution in one plane is inversely proportional to the total sampling interval in the other. For this reason, the apertures of the very large baseline telescope (VLBT) are pushed as far apart as possible in order to achieve nano-radian resolution. For example, it is desired to utilize apertures with diameters on the order of 10 to 30 meters to image space and astronomical objects to achieve an angular resolution of 10 to 50 nano-radians in the visible. It would be impractical and prohibitively expensive to construct a curved mirror or lens of this diameter out of a monolithic piece of glass while maintaining a high quality optical surface. The advantage of the synthetic aperture technique is that it achieves the resolution of a very large aperture with two smaller apertures positioned diametrically opposite each other.

Lensless Imaging

Imaging systems can be classified either as direct or Fourier. The lens is the only optical device that can produce a direct two-dimensional image instantaneously. Holography produces a direct image but it is a two-step process; so is synthetic aperture. However, synthetic aperture can extend the aperture beyond the limits of a lensed system. For this reason, it has been the goal of imaging system designers to eliminate the lens, especially in the push toward bigger apertures. It is worth noting, however, that even though holography replaces the lens with a grating, the synthetic aperture technique does not preclude using a lens. A lens can be masked entirely except for two pinholes, for example, and the interference pattern is transformed from a focused Airy pattern to a sinusoidal interferogram. In fact, A. A. Michelson's early experiment in 1920 atop Mount Wilson, which gave birth to stellar interferometry, consisted of a lensed synthetic aperture system. He covered most of the 10' telescope except for two 6" diameter holes. However, Michelson did not produce a complete imaging system. His goal was to measure the stellar diameter. He managed to observe the fringes and make quantitative measurements in spite of atmospheric turbulence, which caused the fringes to wander and drift. This demonstrated the tolerance of the synthetic aperture technique to atmospheric disturbances by virtue of spreading the light in the image plane, i.e. observing an interferogram instead of a focused image, besides the ability to position the outer mirrors at distances greater than the diameter of the telescope. Nevertheless, the potential of the synthetic aperture technique is to deliver a high resolution image without using a lens.

Therefore, one goal of this invention is to produce a two-dimensional image and demonstrate high resolution without using a lens. Another goal of this invention is to produce as close to a direct image as possible, i.e. to display the image in real space and time by simplifying the algorithm and minimizing the computations.

Magnification

A fundamental aspect of imaging is the magnification. The overlap of waves in the image plane of a lens forms a perfect image, but the size of the observed image cannot be related to the size of the real object unless the distance between the object and the lens is known. In principle, the plane of the image and the magnification can be determined experimentally at the location of best focus. However, for distant objects the image plane coincides with the focal plane, and the linear magnification vanishes. If no focusing element is used then the fringes become non-localized and form in any region of overlap in the far field. The lens reproduces the far field or Fraunhofer conditions in its focal plane and provides a length scale, i.e. focal length by which off-axis distances are measured. Holography, on the other hand, does not focus or localize the fringes and usually produces an image with unit magnification if the same wavelength that was used to write the hologram is used again to read it. Holography circumvents the issue of magnification; however the real image is formed symmetrically about the plane of the hologram at equal distance from where the object originally stood. Thus, it would be impractical to image distant or space objects holographically because the image would be located far away in space in the opposite direction from the object. The synthetic aperture technique does not resolve the issue of magnification either without prior knowledge of the size of the object or its distance. Under coherent illumination the pin holes sample two conjugate frequencies from the spectrum of the electric field. The measurement of the complex visibility yields the ratio of the two amplitudes of the waves and their phase difference. But it is not possible to relate the measurement to a specific spatial frequency component or angle of diffraction unless the distance to the object is known. In the absence of such knowledge, an image resembling the object can be synthesized by inverse Fourier transformation but it would be related to the real object through an unknown scaling factor. The spatial frequency of the fringes in the image plane is not related to the spatial frequencies of the object. It depends on the spacing between the holes and the distance between the pupil and image planes. In the coherent case it is not possible to identify the central fringe because all the fringes have equal visibility, and therefore it is not possible to determine the exact magnification. In the case of incoherent illumination the measurement of visibility yields an estimate of the complex degree of coherence. It is possible to pin point the central fringe in an incoherent interferogram because of the decaying envelope of the fringes due to finite temporal coherence. However, this does not yield a direct measurement of the spatial components of the irradiance function of the object. Either the size of the object or its distance from the pupil plane must be known in order to properly characterize the object. However, for very distant objects the visibility measurement can be related to the angle subtended by the diameter of the object as observed from a point in the pupil plane. This fact is widely used in astronomy to estimate angular diameters of stars, rather than image objects at finite distances with known magnification.

Determining the scaling factor between the reconstructed image and the actual object requires knowledge of either distance to the object or to the image plane. However, in an afocal system, which does not use a lens there is no unique image plane. The fringes are non-localized and can be observed at any plane within the overlap region in the far field.

The synthetic aperture technique does not measure the phase difference between two non-conjugate orders. The inversion of the Fourier Transform necessary to reconstruct the image requires knowledge of the phase relationships among all the constituent orders. Thus, the synthetic aperture technique does not measure the amplitude and phase as a function of the angle of diffraction. Furthermore, measurement of the complex visibility does not yield enough phase relationships among the diffracted orders to permit computation of the inverse Fourier Transform.

Longitudinal and Lateral Imaging

It is desired to enhance the resolution of optical imaging systems. An object has three-dimensions, one longitudinal along the optical axis, and two lateral dimensions. It is desired to enhance the longitudinal as well as lateral resolutions. Light from an idealized point source passes through an optical system and is projected on a screen in the far field perpendicular to the optical axis. The light interferes on the screen and forms the image of the point source, which is the point spread function (PSF). Information about the point source is obtained by analyzing the PSF. Wave front dividing systems consist of one or more apertures. The PSF is the Fourier Transform of the aperture plane. Qualitatively described, the width of the light distribution in the far field is inversely proportional to the width of the apertures. The PSF of a single circular aperture is the Airy pattern, while that of a rectangular aperture is the sin(x)/x function. A typical PSF of a single aperture system has a width equal to $f\lambda/a$, where a and f are the width and focal length of the imaging system, respectively, and $\lambda$ is the wavelength of light. The PSF of a system of two apertures separated by a distance D consists of sinusoidal fringes of period $f\lambda/D$. The fringes are modulated by an envelope of width $f\lambda/a$, corresponding to the width a of each aperture. Thus, the PSF of a two-aperture system consists of D/a fringes. This is typical of diffraction-limited systems. Another factor, which affects the interference, is the degree of coherence of the light source. A perfectly temporally coherent point source produces fringes, which are only diffraction limited. A partially coherent point source yields a number of fringes, which is equal to the coherence length of the source, $L_c$, divided by the wavelength $\lambda$. Thus, the number of fringes is given by D/a, or $L_c/\lambda$, whichever is smaller; that is the system is either diffraction limited or coherence limited.

Wavefront Division and Amplitude Division

Wave front division (WD) imaging systems, such as the Michelson stellar interferometer, which is based on Young's Experiment, focus the light on two narrow apertures, such as slits or holes. Several apertures or sub-apertures can be used, which create a speckle pattern in the focal plane. These systems are diffraction limited Amplitude dividing (AD) systems, such as the Mach-Zehnder or Michelson interferometer are often used to create sinusoidal fringes by interfering two collimated beams at full aperture. These systems are usually coherence limited rather than diffraction limited. It is often desired to image faint sources. For this reason the beams are usually partially focused or compressed to a narrower cross-section using optical reduction. This enhances the signal to noise ratio and improves the quality of the image. The intersecting beams subtend a half angle $\theta$. For small angles, the period of the fringes is equal to $\lambda/2\theta$ or $\lambda/(2\text{ NA})$, where NA is the numerical aperture of the imaging system. The position of the fringes is determined by the phase difference between the beams. A shift in phase causes the fringes to move in the observation plane. The key to enhancing the resolution of imaging systems is tracking the motion of the fringes. Longitudinal and lateral displacements of the point source cause the fringes to move by different amounts. For example, WD systems are less sensitive to longitudinal motion because the phase difference at the two apertures remains almost unchanged. Similarly, AD systems are less sensitive to lateral motion of the mirror. For this reason, WD systems, such as the stellar interferometer and the microscope are used for lateral imaging, while AD systems, such as the Michelson and Mach Zehnder and Twyman-Green interferometers are used for longitudinal imaging with the use of a reference arm. Longitudinal imaging systems usually image a single source, whereas lateral imaging systems image multiple sources.

Image of a Point Source Through Two Apertures

The image of a point source through a system of two apertures is a sinusoidal fringe pattern, which has a limited lateral range. The number of fringes is determined by the diffraction from the two apertures and the temporal coherence properties of the light source. The period of the fringes is determined by the numerical aperture of the optical system and the phase is determined by the angular position of the point source relative to the optical axis. The amplitude of the fringes is determined by the brightness of the source. The central fringe corresponds to the point on the observation plane where the optical path length difference between the two arms of the interferometer is zero. The images of two point sources overlap. The phase difference between the two central fringes of two point sources is the image of the object contained between those two points. The images of several points yield overlapping sinusoidal fringes with different amplitudes and phases. The light distribution consisting of the superposition of all these fringes is recorded with a CCD array or a photodetector. Imaging of the points is equivalent to unraveling the individual phases and amplitudes.

Visibility

The light source is often faint and very distant from the optical system. The light must travel through some atmosphere before it reaches the detector. The atmosphere often interferes with and degrades the quality of the image. Specifically, the atmosphere introduces a random and time varying phase shift to the fringes. However, the relative phase shifts between the fringes and the period of the fringes are unaffected. An effective technique to cancel the effect of the drift and recover the original phases is to measure the visibility of the fringes, i.e. the ratio of intensity variation to the average optical power. The visibility of the superposition of fringes is a function of the relative phases but also depends on the amplitudes. For this reason, visibility techniques are usually limited to bright sources of equal brightness.

Synthetic Imaging Technique

Two-aperture systems have the potential for higher angular resolution than single aperture systems of comparable size because of the ability to discern a phase change of a fraction of $2\pi$. A typical interferometric configuration that is commonly used for lateral imaging is the Michelson stellar interferometer (MSI), which is based on Young's Experiment. A schematic representation of this configuration is shown in FIG. 1. The basic concept consists of only two narrow slits, however, mirrors are added to gain sensitivity because the mirrors can be placed much farther apart. Collimated light from distant sources is focused by the system of mirrors $M_1$ and $M_2$ on slits $S_1$ and $S_2$ by mirrors $M_3$ and $M_4$. The optical path lengths traveled by all the rays in one arm of the interferometer are equal. For a point source located at an angle $\theta$ relative to the axis, the optical path length difference between the two arms is $L\theta$, where L is the separation between the outer mirrors $M_1$ and $M_2$. The purpose of the inner mirrors is to focus the light on the slits. The distance between the slits is chosen to yield the desired numerical aperture of the imaging system. The angle between the interfering rays at any point in the image plane is determined by the numerical aperture NA and is independent of the angle of incidence. The period of the fringes, $\lambda/(2 NA)$, can be chosen arbitrarily as long as the fringes can be viewed with available photodetectors. The size of the image, i.e. the phase difference between the images of two points is proportional to the separation L. As L is increased the size of the image increases and the visibility v of the central fringe changes. v is plotted vs L. The image is obtained by taking the inverse Fourier Transform of v(L) according to the Van Cittert-Zernike theorem. Thus, the imaging resolution is inversely proportional to the sampling interval L. For this reason the mirrors of the Very Long Baseline stellar Interferometer are placed very far apart, up to hundreds of meters, in order to gain angular resolution. This is equivalent to unraveling the phases of the sinusoidal fringes in the image plane. If it is desired to image N point sources each having a different brightness, then we have 2N unknowns corresponding to the N phases and N amplitudes. Scanning the mirrors, i.e. changing L is equivalent to providing a set of 2N equations for the 2N unknowns. Thus, inverse Fourier transforming v(L) by the Van Cittert-Zernike theorem is equivalent to solving a system of 2N equations by 2N unknowns. Obtaining the relative phases and amplitudes of the fringes corresponding to the point sources that make up an object is tantamount to imaging the object. This is known as synthetic imaging.

Sheared Wavefronts

An interferometer splits an original wavefront and then recombines it with itself. Typically the wavefront is sheared, that is a portion of the wavefront interferes with another portion of the same wavefront upon recombination. Different interferometric configurations exhibit different amounts of shear. For example, wavefront dividing interferometers exhibit no shear because the original wavefront is destroyed upon focusing. A new wavefront emerges from each slit and the shear is lost. All the rays being focused on one slit in one arm of the interferometer have equal optical path lengths. The interference beyond the plane of the apertures is governed by the diffraction from the slits. By contrast, amplitude splitting interferometers exhibit shear.

Erect and Inverted Shear

The shearing properties of interferometers are best illustrated using collimated light. Imagine that light from a point source is collimated and directed at an amplitude splitting interferometer, such as Michelson or Mach Zehnder. The incident wavefront is split by a partially reflecting/transmitting mirror along two different paths. The split beams are redirected by mirrors tilted at the proper angle to create either spatial or temporal fringes. The fringes are created at full aperture and the interference is more coherence than diffraction limited. If an imaginary line is drawn along the middle of the incident wavefront bisecting it in half, and the two split wavefronts are made to overlap completely on the detector, then depending on the number of mirrors encountered in each path each half of the original wavefront will either interfere with itself or with the other half upon recombination. If the difference between the number of reflections along the two paths is even, such as the Michelson configuration where each beam experiences two reflections, then each half will interfere with itself and the shear is erect. If on the other hand the difference is odd, such as the Mach Zehnder configuration (leaving out the exit beam combiner) where one beam encounters two mirrors along its path and the other beam only one, then each half of the original wavefront will interfere with the other half and the shear is inverted. This terminology is analogous to the imaging properties of a lens, which depending on the location of the object will either create an erect or inverted image. It is usually desirable to achieve complete overlap of the two wavefronts. However, the amount of shear can be varied by displacing the mirrors to vary the overlap between the two intersecting beams. In the case of erect shear the shear is constant across the wavefront, i.e. the separation between any two interfering rays in the original wavefront is constant. This is the case of shearing interferometers, which are commonly used to measure tilt of wavefronts. In an inverted shear configuration the shear varies across the wavefront. An arbitrary number of mirrors can be added to each path of the interferometer, which will not change its shearing properties as long as the difference remains either even or odd.

Diffractionless Interferometer

If the slits in the MSI design of FIG. 1 were removed in order to eliminate their diffraction effects and the two wavefronts were allowed to propagate and interfere at full aperture on the image plane, then we would obtain the erect shear configuration of FIG. 2. The beams could also be partially focused or reduced optically in order to limit the area of interference and raise the signal to noise ratio.

Mirrors $M_3$ and $M_4$ are oriented slightly differently from those in FIG. 1 in order to cause the two beams to interfere at a shallow angle, for example about 0.75 degree to yield detectable fringes with a period of about 20 microns for visible light. The distance between mirrors $M_3$ and $M_4$ is chosen in conjunction with the distance to the image plane to yield the desired NA. The period of the fringes is not critical because the visibility is measured, which is independent of period. A change of θ in the angle of incidence corresponding to two point sources yields an optical path length difference of Lθ, which causes a phase shift of (Lθ/λ)2π regardless of the fringe period. Thus, the phase and image vary linearly with the size of the object. Even though the angle of each beam falling on the observation plane changes with the angle of incidence, the subtended angle between the two beams remains constant because the beams track each other. This insures that the period of the fringes remains constant. However, the fringes turn and change their phase in the observation plane. The result is that two distant point sources yield identical fringe patterns that are displaced from each other by a phase shift corresponding to the image. This is similar to the stellar interferometer of FIG. 1. The imaging resolution is obtained from the analysis of the visibility v of the central fringe plotted against the outer mirror separation L. For higher resolution, L is increased. In conclusion, if diffraction plays a significant role in the interference or if the shear is erect, then the imaging is obtained from analysis of the visibility and the angular resolution is enhanced by increasing the distance between the outer mirrors.

SUMMARY OF THE INVENTION

This invention enhances the resolution of optical imaging systems by creating a phase change due to change in the angle of incidence without lateral shear. A beam of light is split and the two beams are recombined with complete overlap. The phase change between the two beams varies with the angle of incidence. This invention concerns creating an image of a laterally extended object interferometrically without using a lens.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1 illustrates a Michelson stellar interferometer;

FIG. 2 illustrates an erect shear interferometer;

FIG. 3 illustrates an inverted shear interferometer;

FIG. 4 illustrates an interferometer using two curved mirrors;

FIG. 5 illustrates an interferometer with reduced cross section;

FIG. 6 illustrates an amplitude splitting imaging interferometer.

FIG. 7 illustrates a rotation sensor. FIG. 7a the light source and interferometer turn at the same rate, FIG. 7b part of the interferometer turns relative to the rest of the interferometer and the light source, FIG. 7c the whole interferometer turns as a unit relative to the light source.

DETAILED DESCRIPTION OF THE INVENTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including", "comprising," or "having", "containing", "involving", and variations thereof herein, is meant to encompass the items listed thereafter and equivalents thereof as well as additional items.

Motion of the Fringes

The distinction between erect and inverted shear has major implications on the motion of the fringes. In the case of erect shear, the fringes do not change their period as the angle of incidence changes. They merely change phase and displace, similar to divided wavefront diffraction limited systems. On the other hand, in inverted shear systems the fringes change their period in response to angular variations. Since imaging is a matter of tracking and discerning the motion of the fringes, the two configurations have distinct imaging properties. This can be achieved simply by adding one mirror in the path of one arm of the interferometer to make it asymmetrical.

Fringe Detection

The interference pattern from two apertures consists of spatial fringes and is usually detected with the use of a CCD array. Alternatively, the fringes can be scanned past a fixed CCD and recorded sequentially in time. The interfering beams can also be combined with the use of a partially reflecting/transmitting mirror and detected with a simple photodetector to produce temporal fringes. Similarly, the interference pattern of an AD system can be observed spatially by orienting the beams to intersect at a shallow angle, such as 1.5 degree. This yields a fringe period of about 20 microns for visible light, which covers two pixels of a typical state-of-the-art CCD array. The emerging wave fronts in AD systems could also be made parallel and collinear and the fringes observed temporally. Since the period of a fringe, λ/2θ, depends on the angle of incidence θ, different wave fronts set up fringe patterns with different spatial frequencies. Proper sampling of the spatial light distribution requires use of CCD arrays whose pixel size is shorter than half the period of the highest spatial frequency, according to the Nyquist criterion. Also, the sampling interval and the number of pixels, i.e. the length of the CCD array is inversely proportional to the spatial frequency resolution. Thus, achieving a certain frequency, hence angular resolution requires the use of a CCD with a certain minimum length.

Frequency Technique

If one mirror, denoted by M5 in FIG. 3, is added to one arm of the interferometer, then a condition of inverted shear is created. The period of the fringes changes with the angle of incidence because the two interfering beams turn in opposite directions. Thus, two point sources create two fringe systems with unequal periods. Not only are they displaced in phase but also have different spatial frequencies. This gives rise to a variable phase difference. The imaging properties of this system can be obtained by taking the discrete Fourier Transform (DFT) of the fringes themselves, rather than scanning the mirrors and Fourier transforming the Visibility function as with erect shear. The visibility cannot be defined properly because the constituent periodic waves have different spatial frequencies. If the rays were traced along each path of the interferometer then it is found that the separation between the two rays interfering at any point varies across the observation plane, hence inverted shear. In this case the actual period of the fringes does matter because the spatial frequency is measured. The phase and image vary non-linearly with the angle of incidence because the constant of proportionality, L, itself varies with θ. It is this property that allows the achievement of a high angular resolution for smaller L. Therefore; it becomes critical to know the absolute fringe period because it is the spatial frequency that is actually measured rather than the visibility. The angular resolution becomes a matter of discerning frequency rather than phase changes. The frequency resolution $f_{res}$ is directly proportional to the angular resolution, $f_{res}=2\theta_{res}/\lambda$. Therefore; a reading of the DFT of the fringe pattern yields a direct reading of the angular position and brightness of the point sources. This is an alternative synthetic imaging technique, which is analogous to Fourier transforming ν(L) by the Van Cittert-Zernike theorem.

Frequency Resolution

The frequency resolution obtained through a discrete Fourier transformation of a spatial signal is inversely proportional to the sampling interval; in this case the length of the fringe pattern $L_{fr}$. This implies that $L_{fr}$ must be equal to Λ/2 in order for the frequency measuring technique to yield the same angular resolution as the phase measuring technique. The fringes must extend over a length half the separation of the mirrors. This suggests that the frequency technique is more applicable to temporally coherent systems. This states that in order to achieve a certain angular resolution, the optical instrument must have a certain minimum size, which proves that the frequency technique does not violate the diffraction limit, even though it may utilize an optical system, which is not diffraction limited. Thus, there are two alternative techniques for synthetic imaging and angular resolution, the phase technique, which was demonstrated by Michelson over a century ago, and the frequency technique, which is described in this paper. Each technique has its advantages and drawbacks. Measuring the phase difference between two fringes requires only a few cycles and can be done with broadband or incoherent sources, such as starlight. The angular resolution increases with the separation between the mirrors; L. Measuring frequency does not depend on L, but requires fairly coherent or single frequency sources. Frequency measurement is equivalent to counting an integer number of cycles. If it is desired to resolve a frequency difference Δf between two signals whose frequencies are f and (f−Δf), then the signals must be sampled over f/Δf cycles over an interval 1/Δf equivalent to the beat length. Nevertheless, the frequency technique has the advantage of being more robust and accurate than the visibility technique, which depends on amplitude, because the measurement of frequency is unaffected by intensity fluctuations. Another advantage of the frequency technique is that the CCD array can be segmented since the phase is not being tracked. This obviates the need for long monolithic CCD arrays. It is possible to magnify the angular change and effectively reduce the beat length with the use of optical reduction techniques or partial focusing, which also enhances the signal to noise ratio.

Scanning the Angle of Incidence to Vary the Size of the Image

The ideal solution would be a combination of both techniques to maintain a good angular resolution while reducing L, by making use of the fact that the phase changes non-linearly with the angle of incidence. The purpose of increasing the distance between the mirrors in the diffraction limited configuration was to increase the phase corresponding to a certain angular separation θ, because the optical path length is equal to Lθ. The same objective can be achieved with the inverted shear configuration by scanning the angle of incidence without changing L, because the size of the image varies with the angle of incidence. Thus, it is possible to increase the phase difference between the fringes corresponding to two point sources simply by turning the interferometer past the stationary point sources so as to change their angular positions relative to the axis. The phase is very sensitive to minute changes in the angle near normal incidence as the period of the fringes becomes infinite. This technique can be used to vary the relative phases of the sinusoidal fringes by turning the interferometer incrementally to yield a system of 2N equations for 2N unknowns, which can be solved for the N phases and N amplitudes, effectively producing a synthetic image of N points analogous to the visibility technique. Scanning is necessary for fairly coherent sources in order to capture the entire fringe pattern with a limited size CCD array. As the interferometer is turned, the fringes corresponding to different point sources move past the photodetector while changing their relative phases. The CCD records the different frames and produces a temporal signal from which the different phases can be computed. If it is desired to discern two frequency components that are f and (f−Δf), then the angle is scanned until the accumulated phase difference between the two fringes passing over the active region of the photodetector is a complete cycle.

The two interfering beams in FIG. 3 are incident along two different paths A and B, and intercepted by mirrors $M_1$ and $M_2$. Mirrors $M_3$ and $M_4$ direct the light to interfere at the proper angle in the observation plane. The beams A and B originate from the same point source, which is assumed to be distant so that the light reaching the interferometer is collimated and the two beams are separated by a distance L. Achieving a certain angular resolution requires a certain minimum separation. This invention teaches a method of reducing L while maintaining a good angular resolution.

DESCRIPTION OF THE INVENTION

This invention is described with the use of geometric optics as shown in FIG. 4. The two beams $A_1$ and $B_1$ are derived from the same wavefront C. Incident beam C is split by a system of two parallel mirrors $M_6$ and $M_7$. Beam C is incident on mirror $M_6$ at angle $\theta_1$. The two parallel beams $A_1$ and $B_1$ are separated by a distance $L_1$ and intercepted by a curved mirror $CM_1$, whose axis $E_1$ is parallel to the direction of $A_1$ and $B_1$. The distance between beam $A_1$ and axis $E_1$ of $CM_1$ is denoted by $X_1$. The curved mirror $CM_1$ focuses the beams $A_1$ and $B_1$ at its focus F. The focused beams $A_1$ and $B_1$ are further intercepted by a second curved mirror $CM_2$, which shares the same focal point F with the first curved mirror but whose axis $E_2$ is tilted by an angle $\theta_0$ relative to axis $E_1$ of $CM_1$. The angle $\theta_0$ can take any value between $-\pi$ and $\pi$. The curved mirrors have two focal lengths $f_1$ and $f_2$ that are not necessarily equal and can have any suitable shape that provides a focus, such as for example parabolic or paraboloidal. Upon reflection from $CM_2$ the two beams $A_2$ and $B_2$ are again parallel and separated by a distance $L_2$. They are recombined at D using a system of two parallel mirrors $M_8$ and $M_9$. Beam $A_2$ is incident on mirror $M_8$ at angle $\theta_2$. The mirrors $M_8$ and $M_9$ are oriented so that a change in $\theta_1$ causes a change in $\theta_2$ of the same polarity as in FIG. 4. Alternatively, the mirrors $M_8$ and $M_9$ can be flipped symmetrically about the $A_2$ direction to yield the opposite polarity. The distances $L_1$ and $L_2$ are not necessarily equal. Similarly, the angles $\theta_1$ and $\theta_2$ are not necessarily equal. A change $d\theta_1$ in the angle $\theta_1$ causes the phase of beam $A_1$ to advance by $(L_1 d\theta_1/\lambda)2\pi$ relative to that of beam $B_1$. It also causes the angle $\theta_2$ to change by $d\theta_2$ and the phase of beam $A_2$ to retard by $(L_2 d\theta_2/\lambda)2\pi$ relative to that of beam $B_2$. Thus, the total optical path length change is $L_1 d\theta_1 - L_2 d\theta_2$ upon recombination at D. The different parameters can be chosen so that $L_1 d\theta_1$ is different from $L_2 d\theta_2$ when $\theta_0$ is different from zero or $\pi$. This yields a net phase change in response to a change in the angle of incidence.

Example 1

As an example the parameters $f_1$, $f_2$, $X_1$, and $L_1$ are chosen as follows: $f_1 = f_2 = f$, $X_1 = 0.828$ f, and $L_1 = 0.414$ f, where f is an arbitrary number, which provides a length scale of the interferometer. Then we obtain $L_2 = 0.417$ f, $d\theta_2/d\theta_1 = 1.828$, and $L_2 d\theta_2 = 1.841 L_1 d\theta_1$. Thus, $L_2 d\theta_2 - L_1 d\theta_1 = 0.841\ L_1 d\theta_1$.

Example 2

As another example the parameters are chosen as $f_1 = f_2 = f$, $X_1 = f$, and $L_1 = f$. This yields $L_2 = 0.914f$, $d\theta_2/d\theta_1 = 1.656$, and $L_2 d\theta_2 = 1.514\ L_1 d\theta_1$. Thus, $L_2 d\theta_2 - L_1 d\theta_1 = 0.514\ L_1 d\theta_1$.

These examples demonstrate that it is possible for the phase to maintain angular sensitivity even when the two beams A1 and B1 are derived from a single wavefront C, whose cross-section is much narrower than the distance $L_1$ between $A_1$ and $B_1$. The incident wavefront C is split internally to create the two beams $A_1$ and $B_1$. Beams $A_2$ and $B_2$ set up a system of spatial fringes in the vicinity of mirror $M_9$, which picks up the phase at its location and recombines the beams. The results of Examples 1 and 2 indicate that the phase angular sensitivity $L_2 d\theta_2 - L_1 d\theta_1$ varies with the offset $X_1$ between the incident beam $A_1$ and the optical axis $E_1$. This is due to the variation of the spatial frequency of the fringes with the angle of incidence. Thus, a different angular sensitivity is obtained by moving mirror $M_9$ to a different location.

Mirrors $M_8$ and $M_9$ are replaced by the system of mirrors $M_{10}$, $M_{11}$, $M_{12}$, $M_{13}$ and $M_{14}$, as shown in FIG. 5, to create an inverted shear configuration. A photodetector or CCD array can be placed at any location in the observation plane to pick up the phase. Alternatively, mirror $M_9$ can be used to recombine the beams and provide a temporal signal. Mirrors $M_{10}$-$M_{14}$ in FIG. 5 are analogous to mirrors $M_1$-$M_5$ in FIG. 3. The main distinction between the configurations of FIGS. 3 and 5 is that the path length angular sensitivity of FIG. 3 is $Ld\theta$, while that of FIG. 5 is $L_2 d\theta_2 - L_1 d\theta_1$. Most importantly, the wavefronts $A_1$ and $B_1$ of FIG. 5 are derived from single wavefront C and merged into single wavefront D, whereas the wavefronts A and B in FIG. 3 are not derived from a single wavefront. This invention teaches a method of providing phase sensitivity to changes in the angle of incidence of a single wavefront with a reduced cross-section, which is split internally to create two beams that are separated by a distance, which is larger than the cross-section of either beam, utilizing a system of two curved mirrors whose focal points coincide but whose axes are misaligned. The design of FIG. 5 provides a compact configuration, which makes it possible to turn the whole interferometer to scan the angle of incidence.

Rotation Sensor

A rotation sensor consists of a light source and an interferometer. There are three possibilities, as shown in FIGS. 7a, 7b and 7c, respectively. Either:

1) The interferometer turns at the same rate as the light source, in which case there is no physical path length change. The observed phase change is relativistic due to the speed of light being finite. This is represented by the Sagnac interferometer which is commonly used in fiber optic gyroscopes for the measurement of absolute rotation; or 2) Part of the interferometer turns relative to the rest of the interferometer and the light source. This is commonly used as an angular sensor for the alignment of a laser beam; or 3) The whole interferometer turns as a unit relative to the light source.

The first two configurations exist as commercial systems because the beam emanating from the light source can be overlapped completely to exhibit the interference effect corresponding to the phase change due to rotation. However, there is currently no commercial system which embodies the third configuration where the whole interferometer turns relative to the light source because there is no interferometric configuration which provides complete overlap while achieving angular sensitivity. For complete overlap the angle of incidence must be zero. However, at normal incidence the angular sensitivity vanishes. Alternatively, in order to obtain angular sensitivity, an oblique angle of incidence is used, but then cannot achieve complete overlap. For this reason, the only solutions currently are either to break the interferometer or go relativistic. By contrast, the current invention provides a classical method to achieve complete overlap while maintaining angular sensitivity, as shown in Examples 1 and 2 above.

Approach

The perception of an image is determined by its irradiance regardless of the field distribution on the object and regardless of whether the object is illuminated with coherent or incoherent radiation. It would be more advantageous to synthesize the object from the angular spectrum of its irradiance distribution, i.e. by measuring the magnitude of irradiance or intensity as a function of the angle of diffraction. The synthetic aperture technique does not do that.

The goal is to produce an image as close to a direct image as possible, i.e. to display the image in real space and time. A direct image is the result of the superposition and overlap of waves. The creation of the waves may require some computation but the goal is to simplify the algorithm and minimize the computations.

The proposed concept is a new imaging technique, which can be applied to coherent as well as incoherent imaging. When the object is illuminated with a broad source or if it is self-luminous, then it can be modeled as a collection of quasi-monochromatic point sources, which are incoherent, i.e. do not interfere with each other. However, each point source is capable of setting up its own interference pattern. If the object is far away, such as space objects or stars in the sky, then the radiation can be modeled as a superposition of incoherent collimated waves traveling in slightly different directions. A distant object may be illuminated by a continuous wave laser or a pulsed laser having a finite coherence length for the purpose of imaging.

It is customary to study the effects of radiation and propagation for two limiting cases, namely totally coherent or totally incoherent. Most cases fall between these two extremes. Since the concept can be used for both cases with a modification, both cases are illustrated and their similarities and differences pointed out. An effort is made to distinguish between the two types of illumination and keep them separate but the discussion is entwined.

Diffraction, in the strict sense, occurs only under spatially coherent illumination. The diffracted orders are plane waves, which represent the Fourier components of the complex electric field on the object. Even though the diffracted waves are modeled as planar, there is actually a finite width associated with them corresponding to the width of the object. The object and its image are assumed to be small compared to axial propagation distances, according to Fresnel diffraction theory in order to satisfy the paraxial approximation. After certain propagation distance the waves clear each other, i.e. they do not overlap anymore. This is the onset of the far field or the Fraunhofer regime. If the optical system, such as synthetic aperture is placed in the far field, then the pinholes intercept two conjugate waves, the ones that are traveling at angles +θ and −θ off the optical axis. The interference of the waves diffracted from the pinholes would then yield the ratio of the amplitudes of the waves and their phase difference. By changing the distance between the pinholes, the diffracted field could be analyzed two conjugate waves at a time. If the pinholes were placed closer to the object before the far field, then each pinhole would intercept more than one diffracted wave from the object, and the analysis of the diffraction becomes more complicated.

For incoherent radiation there is no far field per say. The radiation from stars and distant objects overlap everywhere in space because each point on the object radiates in all directions. The radiation can be modeled as a superposition of collimated plane waves incident along the direction θ corresponding to the angular position of the star. Unlike the coherent case, these waves cannot be separated no matter how far away the pinholes are from the object. This faintly resembles the near field or Fresnel zone of a coherent object, at least in concept, in that each pinhole must bear the contribution of more than one plane wave emanating from the object. The total contribution from all the incoherent waves at the location of the pinhole is represented by the coherence function, which is given by the van Cittert-Zernike theorem.

The theorem states that the Fourier Transform of the irradiance distribution of the object is given by the coherence function in the plane of the aperture. Thus, there is a Fourier transform relationship between the coordinates in the object plane and the pupil plane. According to Fourier Transform theory, when a function $f$ of coordinate x, i.e. $f(x)$ is transformed it yields a function $F(s)$ where the coordinate s represents spatial frequency in this case. The coordinate s can be replaced with any other appropriate variable, which is proportional to s. For example, in the case of coherent illumination, the off-axis distance in the focal plane or the lateral distance on a screen in the far field is replaced by the angle of diffraction, θ, which is related to the spatial frequency s by $s=\sin(\theta)/\lambda$, where λ is the wavelength of the radiation. The proportionality results under the small angle approximation concomitant with paraxial propagation. Thus, the function $F(s)$ becomes $F(\theta)$ merely through a substitution of variable. This concept applies to incoherent radiation as well, even though there is no diffraction from an incoherent object. The separation between apertures in the pupil plane Δx and Δy, which are normally varied to map the coherence function, can be replaced by the angles of propagation, $\theta_x$ and $\theta_y$, which are proportional to Δx and Δy, respectively. Thus, a measurement of the intensity vs. angle $I(\theta_x, \theta_y)$ yields the angular spectrum, which is related to the Fourier Transform of the irradiance I(Δx,Δy) through a scaling of the coordinates. The problem is that the synthetic aperture technique does not yield a direct measure of $I(\theta_x, \theta_y)$, i.e. intensity vs. angle of propagation of the waves from the object toward the pupil plane. Rather, it yields a measure of the angle subtended by the diameter of the object looking back from the pupil plane toward the object.

Proposed Concept

It would be advantageous to measure the intensity of the radiation as a function of the angle of propagation. It is worth noting that this is NOT equivalent to measuring the magnitude of the diffracted field, i.e. the Fourier Transform of the electric field in the far field for a coherently illuminated object. The reason is that while the intensity or irradiance is the square of the electric field at any point in space and time, it is not so in the frequency domain. Since the intensity is the product of the electric field with its complex conjugate, then the Fourier Transform of the intensity is the convolution of the Fourier Transform of the electric field with that of its complex conjugate, or equivalently, it is the autocorrelation of the Fourier Transform of the electric field in the frequency domain. This involves the phases of the Fourier components of the electric field. Thus, the idea is to synthesize the irradiance of an object, i.e. construct a direct image by adding the Fourier components of the irradiance rather than those of the electric field. This would be the case for either coherent or incoherent objects, except that it is done differently for both cases.

The intensity is the magnitude of the electric field squared in the spatial or temporal domain, but the Fourier component of the intensity at a certain spatial or temporal frequency is NOT equal to the square of the magnitude of the Fourier component of the electric field at that frequency. The lens synthesizes the electric field in the image plane from its Fourier components, but does not yield the Fourier components of the intensity. The lens separates the different Fourier components of the electric field, i.e. the diffracted orders of a coherent object, in its focal plane and discards the phase information. Similarly, it separates the different collimated waves incident from an incoherent object. This does not yield the Fourier Transform of intensity for coherent illumination because the phase of the field is not utilized in the focal plane. For incoherent light, focal plane measurements do yield a measure of $I(\theta_x, \theta_y)$ for distant objects, i.e. the angular spectrum of the irradiance but the measurement is very susceptible to atmospheric aberrations and optical surface imperfections. Further, improving the angular resolution requires increasing the size of the lens, which becomes impractical and prohibitively expensive beyond a certain limit. It is desired to separate the image plane from the focal plane, i.e. produce non-localized fringes. Thus, the focal plane of the lens loses its usefulness. For this reason the lens can be eliminated.

The synthetic aperture technique does not yield the angular spectrum of the irradiance. For distant incoherent objects, the angular spectrum of the irradiance is more useful than the Fourier Transform. For coherent radiation not enough phase information is provided by the synthetic aperture technique to permit construction of the field or intensity profile, which explains why the synthetic aperture technique is almost exclusively used in conjunction with incoherent radiation. The synthetic aperture technique does not measure the intensity profile vs. angle of propagation. For this reason, a technique is proposed to measure the intensity directly as a function of the angle of propagation, i.e. $I(\theta_x, \theta_y)$. Thus, the proposed device is an angular sensor. The task of imaging becomes a matter of sensing and plotting the number of photons incident along a certain direction $(\theta_x, \theta_y)$. The imaging technique consists of synthesizing the irradiance pattern directly from its angular components. The proposed technique is an alternative to the synthetic aperture technique.

Amplitude Splitting and Wave Splitting Interferometers

All interferometers can be classified as either amplitude or wave splitting, which are described in textbooks Amplitude splitting interferometers, such as Michelson's or Mach-Zehnder split a wavefront into two beams using a partially reflecting and transmitting mirror and then recombine the beams after traveling along different paths. Michelson's interferometer recombines each ray of the wavefront with itself. For this reason it is used for temporal correlation and spectral imaging. The Mach Zehnder can be of the shearing type, i.e. recombines one portion of the wavefront with another portion shifted laterally; or inverting, i.e. recombines the left half of the wavefront with the right half and vice versa. Wavefront splitting interferometers sample the wavefront at two different points, such as the stellar interferometer, which is based on Young's two slit experiment. Two-dimensional spatial imaging has conventionally been done using wavefront splitting. However, amplitude splitting can also be used for spatial imaging in conjunction with multiple wavefronts.

It is desired to synthesize the irradiance of an object from its Fourier or angular components. But the Fourier components of the irradiance function are not readily available. It requires some level of computation. The goal is to keep the algorithm as simple as possible. Furthermore, it is desired to display the image in real space and time. This requires the overlap of waves, which represent all the Fourier components of the irradiance function. By contrast, the synthetic aperture technique does not provide a real space and time image because the waves are sampled only two at a time. The other waves are not available simultaneously and the image can be constructed only computationally.

A lens separates the waves in the focal plane and recombines them in the image plane while maintaining the appropriate angle and phase relationships. Coherent image formation by a lens, according to Ernst Abbe's theory, which was proposed in 1873, consists of overlapping the waves in the image plane at the same angles at which they originally diffracted from the object to recreate the spatial frequencies of the electric field. The angles are scaled proportionately in the case of magnification. The overlapping waves interfere to recreate the electric field distribution.

There are two ways to reconstruct a real spatial image: Either
1) Overlap the waves to reconstruct the image by interference by attempting to recreate the electric filed conditions that once existed in the object plane. Or,
2) Create waves which represent the Fourier components of the irradiance by whatever means, and just add them without interference.

The first method represents Ernst Abbe's theory. The second technique is the proposed concept. If the correct Fourier components of the intensity profile were somehow guessed or computed including their amplitudes, phases and spatial frequencies, and sinusoidal waves were created representing this information, then the irradiance of the object could be reconstructed simply by the superposition of those waves without any interference. The task is to create the intensity waves.

If the spatial distribution of the electric field in the object plane is represented by $\underline{E}(x,y)$ where the underline denotes a complex quantity having a phase, then the spatial distribution of intensity or irradiance of the object, which is a real positive function, is given by $I(x,y)=|\underline{E}(x,y)|^2$. The Fourier Transform of the electric field, which is also a complex quantity, is denoted by $\underline{E}(f_x,f_y)$ where $f_x$ and $f_y$ are the spatial frequencies in the x and y directions, respectively. Similarly, The Fourier Transform of the intensity can be expressed as $\underline{I}(f_x,f_y)$, which is a complex quantity having a phase associated with the particular Fourier component of intensity. It is important to note that $\underline{I}(f_x,f_y)$ is NOT equal to $|\underline{E}(f_x,f_y)|^2$. Thus, the quantity $\underline{I}(f_x,f_y)$ cannot be obtained from the focal plane of the lens because Fraunhofer diffraction yields only $|\underline{E}(f_x,f_y)|^2$. $\underline{I}(f_x,f_y)$ could however, be computed from $|\underline{E}(f_x,f_y)|$ if the phase of $\underline{E}(f_x,f_y)$ were known. However, that phase is discarded and cannot be retrieved from focal plane measurements. Given that the intensity is the product of the electric field with its complex conjugate in the spatial domain, the Fourier Transform of the intensity is the autocorrelation of the Fourier Transform of the electric field in the spatial frequency domain. Computing the autocorrelation entails shifting a waveform relative to itself and multiplying the complex values of the electric field at different frequencies and summing it up over all frequencies. Thus, knowledge of the phases of $\underline{E}(f_x,f_y)$ at all frequencies is necessary in order to perform the autocorrelation. The synthetic aperture technique yields the phase difference of $\underline{E}(f_x,f_y)$ for the coherent case but only for a conjugate pair of frequencies +f and −f, which are intercepted by the instantaneous locations of the pinholes. No phase relationships among non-conjugate orders are given by the synthetic aperture technique to permit computation of the intensity spectrum or the inverse Fourier Transform. For this reason, an alternative interferometric imaging technique is proposed.

The light incident from an object consists of collimated waves. In the case of coherent illumination the collimated waves are diffracted plane waves. In the incoherent case the waves originate from quasimonochromatic points on a distant object. The waves travel in slightly different directions off-axis. It is desired to measure the intensity of each wave as a function of the angle of propagation. The angle of propagation is proportional to a spatial frequency component of the object. Thus, if the angle of propagation is measured, i.e. if the number of photons that are traveling in a particular direction is known then the irradiance of the object could be synthesized from its angular spectrum. There is no optical device, which performs such a function currently other than the lens. In the interest of improving the spatial resolution, it is desired to replace the lens with planar optical surfaces, which do not require high fabrication tolerances. The proposed concept provides an interferometric design which achieves such functionality lenslessly.

Any function can be synthesized from its Fourier components. In particular a real function, such as the irradiance of an object, has a symmetrical transform, i.e. the conjugate waves traveling above and below the optical axis are in fact hermitian conjugates having equal amplitudes but opposite phases. Thus, the Fourier Transform of the intensity function need only be computed for positive frequencies. However, this requires knowledge of the phases of the electric field for all frequencies to compute the autocorrelation.

Coherent waves from finite objects are separated in the focal plane of a lens but made to interfere in the image plane. On the other hand, for incoherent distant objects the focal and image planes merge and the waves are separated. No interference occurs in the focal plane. The reconstruction of the image is due to multiple beam interference, which obtains for coherent as well as incoherent radiation because the waves travel equal optical path lengths between the object and image planes. This is analogous to the phenomenon that gives rise to Finesse in the temporal domain. Successive reflections from the two opposing mirrors of a Fabry-Perot interferometer result in multiple beam interference, which exhibits peaked reflectance compared to the sinusoidal fringes obtained with two-beam interferometers such as Michelson or Mach-Zehnder. Thus, the contributions of all the sub-apertures in the spatial domain are analogous to the multiple reflections in the temporal domain, except that the path length difference is zero and the free spectral range is infinite. This explains why a lens produces a single Airy shaped point spread function, whereas the Fabry-Perot has a periodic transfer function.

The angle of propagation of a wave, as it leaves the object, represents a particular spatial frequency component. In the case of coherent radiation the intensity of the diffracted wave represents the magnitude of the electric field squared, not the irradiance of the object. For incoherent radiation the intensity of the wave represents the irradiance $I(\theta_x,\theta_y)$. A real function can be synthesized if sinusoidal waves of the appropriate amplitude, frequency and phase are superposed in a plane or region of space, such that they add algebraically. This is the definition of Fourier synthesis. The waves do not have to represent electric fields or interfere with each other. In fact, it would be preferable if the waves were incoherent so that they just add. Thus, the task of reconstructing the image becomes that of creating overlapping sinusoidal patterns whose amplitudes and phases correspond to the Fourier components of the irradiance pattern. The sinusoidal waves are created with the use of amplitude splitting interferometer.

In a wavefront splitting interferometer the spatial frequency of the sinusoidal fringes produced by the diffraction from the holes has no relevance to any spatial frequency of the object. The fringes are merely a carrier and their spatial frequency is determined by the distance between the holes $\Delta x$ and $\Delta y$ in the pupil plane. In the synthetic aperture technique the coherence is obtained from measurement of the visibility of the fringes rather than their spatial frequency. The fringes corresponding to different points on the object have the same frequency but exhibit a phase shift. When the path length difference between the rays from two distant points reaching the two slits varies by $\lambda/2$ the two fringe patterns are displaced by half a fringe and the visibility vanishes if the two point sources are equally bright. This is an important issue which limits the dynamic range of the synthetic aperture technique because of the dependence of the visibility on intensity. This introduces an error in the measurement of phase. When two or more sinusoidal waves with 100% modulation having the same frequency are added, the resulting wave is sinusoidal of the same frequency but with a visibility less than one. The visibility of the combined wave depends not only on the phase differences among the constituent waves but also on their relative amplitudes. This limits the ability of interferometric telescopes to resolve a faint star in the vicinity of a bright star. The resulting visibility measurement depends not only on the positions of the stars but also on their relative brightness. The coherence function being the Fourier Transform of the irradiance of the object depends on the brightness distribution of the source. The Fourier Transform of a bright source eclipses that of a nearby faint source.

By contrast, the proposed technique is not a wavefront splitting interferometer and does not use sub-apertures. It measures the intensity vs. angle $I(\theta_x,\theta_y)$ information directly. It is only position-dependent and completely intensity-independent. Each distant point source creates a sinusoidal fringe pattern with a different spatial frequency, which serves as a marker to identify that particular point source. The amplitude of the fringe is an indication of the brightness of the source. This is in contrast to the synthetic aperture technique, which represents all point sources by sinusoidal fringes of the same frequency but different phases. The proposed technique is unaffected by uneven irradiance distributions on the object. A star located at position $(\theta_x,\theta_y)$ is measured directly to yield the number of photons $I(\theta_x,\theta_y)$ incident along that direction. The measurement is not affected by the presence of another star. The proposed technique measures 'horizontal' quantities, i.e. spatial frequencies rather than 'vertical' quantities such as visibility, which is related to amplitude and phase. Thus, the proposed technique is more advantageous than the synthetic aperture technique by virtue of the frequency measurement, which is more robust than amplitude or phase measurement. The concept of visibility is gone. There is no visibility to measure. The addition of sinusoidal waves of slightly varying frequencies does not yield a combined sinusoidal wave with a visibility. The angular spectrum of the incident radiation is measured. Since each point source is represented by a different spatial frequency, a Fourier transformation of the superposed waves yields the angular spectrum. Each measured spatial frequency corresponds to a certain angular position in the sky.

The proposed technique consists of superposing sinusoidal waves having amplitudes and phases corresponding to the Fourier components of the irradiance function and taking the spatial Fourier Transform of the combined wave. The angular resolution is proportional to the frequency resolution. Thus, the proposed technique creates a direct image but involves a computational step. All the incident waves are intercepted simultaneously. The superposition of all the interferograms reconstructs the irradiance distribution in real space and fairly short time. There is no need to move any mirrors or apertures. By contrast, the synthetic aperture technique must displace the apertures and involves taking an inverse Fourier Transform to compute the irradiance from the coherence function. The synthetic aperture technique does not display an image in real space and time.

A common feature of all computational techniques is that the data is sampled within a finite region of space using the Discrete Fourier Transform (DFT). The frequency resolution is inversely proportional to the total sampling interval. Thus, the system has a finite angular resolution. If the position of a certain star corresponds to a spatial frequency, which is not a multiple integer of the frequency resolution, then that would lead to leakage, i.e. the intensity from that star leaks into adjacent frequencies, which smears the image. This can be corrected by increasing the number of data points. Thus, the proposed technique has the advantage of immunity to uneven irradiance distributions and high dynamic range. It can image a very faint star adjacent to a bright star by virtue of the robustness of the frequency measurement.

The sinusoidal patterns corresponding to the Fourier components of the irradiance profile are formed using standing waves. Each wave diffracted from a coherent object or traveling along a certain direction from a distant incoherent point source is capable of setting up an interferogram consisting of a sinusoidal fringe pattern, when split and redirected to interfere with itself using an amplitude splitting interferometer. There is no interference among different waves. Each wave interferes only with itself to set up a standing wave with a certain spatial frequency that identifies that particular wave uniquely. Since the radiation is redirected using planar mirrors the beam maintains its collimation. The angle of interference can be controlled by orienting the mirrors accordingly. This concept is illustrated in FIG. 6 using a simple Mach-Zehnder configuration. Collimated radiation incident from the object is partially reflected from planar mirror $M_{15}$. The transmitted and reflected beams are further reflected from planar mirrors $M_{16}$ and $M_{17}$, respectively, and intersect at half angle $\alpha$ on the observation plane S. The spatial frequency of the sinusoidal fringes is given by $2(\sin \alpha)/\lambda$. Each wave propagating at angle $\theta$ sets up a distinct fringe pattern with a different spatial frequency. This provides a marker to identify each incident wave. The fringes are captured with a CCD pixel detector array. The fringes are two-dimensional corresponding to the angles $\theta_x$ and $\theta_y$. FIG. 6 is a one-dimensional sketch, which illustrates the concept. The angle $\alpha$ is related to the angle $\theta$ and can be adjusted by changing the orientations of the mirrors. In order for the fringe pattern to synthesize the object irradiance the amplitudes, frequencies and phases of the sinusoidal fringes must match those of the Fourier components of the object. Ideally, the angle $\alpha$ is made equal to the angle $\theta$ to reproduce the object with unit magnification. If the angle $\alpha$ matches the angle $\theta$ for one wave, then it matches it for every wave because the planar mirrors do not perturb the relative angles among the waves. The spatial frequency of the fringes can be adjusted by tilting the mirrors appropriately. The amplitudes of the fringes are derived from the irradiance of the object. Thus, the image can be reconstructed in real space using different algorithms for the coherent and incoherent cases. The proposed imaging concept is a full aperture system.

Algorithms

For coherent radiation the diffracted wave represents the electric field. Thus, the amplitude of the fringes corresponds to $|\underline{E}(\theta_x,\theta_y)|^2$. Therefore, the algorithm starts by taking the Fourier Transform of the fringes, then the square root of it to yield $|\underline{E}(\theta_x,\theta_y)|$. The Fourier Transform of the intensity $I(\theta_x,\theta_y)$ cannot be calculated unless the phase of $\underline{E}(\theta_x,\theta_y)$ is known. But the phase of $\underline{E}(\theta_x,\theta_y)$ cannot be measured. Therefore, an arbitrary phase $\varphi(\theta_x,\theta_y)$ is assigned to $|\underline{E}(\theta_x,\theta_y)|$, which permits the computation of $I(\theta_x,\theta_y)$ through the autocorrelation of $|\underline{E}(\theta_x,\theta_y)|e^{i\varphi(\theta_x,\theta_y)}$. The resulting $I(\theta_x,\theta_y)$ is compared to a picture of the object taken with a lens whose aperture is smaller than that of the proposed imaging system. The process of assigning phases is repeated iteratively until the difference between the calculated and measured intensity profiles converges within a certain error limit set by an appropriate criterion.

It is worth noting that the proposed method of synthesizing the intensity by auto-correlating the electric field is advantageous because it obviates the need to measure the high frequency components. Since the spectrum of the intensity is the autocorrelation of the electric field in the frequency domain, all the components of the electric field for all frequencies contribute to every component of intensity. Therefore, the proposed technique yields a good approximation of the high frequency components of intensity from the measurement of the low frequency components of the electric field.

The main burden of conventional imaging systems is capturing the high frequency components. For this reason imaging systems strive for larger aperture. This is also true for the proposed imaging system because the angular resolution is inversely proportional to the size of the aperture. However, the burden shifts from capturing the high frequency components to guessing the correct phases of the electric field at low frequencies. A fairly good estimate of the high frequency components of the intensity can be obtained from the measurement of the low frequencies of the electric field because they contribute to the autocorrelation. This is in contrast with conventional system design where the high frequency components can only be inferred from the high frequency measurements, thereby necessitating an increase in aperture.

In conclusion, if the optical system is oriented correctly relative to the object then the incident waves set up interferograms whose spatial frequencies are meaningful Fourier or angular components of the intensity profile of the object. The idea is that each wave interferes only with itself. The amplitude splitting interferometer can be configured to provide enough phase delay among the waves to offset any coherent effects. The assignment of phases to the components of the electric field permits calculation of the amplitudes and phases of the Fourier components of intensity, which are then compared to measurements obtained with smaller lensed systems, i.e. a cheap camera, until iterative convergence is obtained.

For incoherent radiation the algorithm is simplified significantly. The amplitude of the fringes is equal to the angular spectrum of the irradiance of the distant object. Thus, a simple Fourier transformation of the fringes yields $I(\theta_x,\theta_y)$.

Image Construction

In order to construct an image of an object, the waves emanating from the object must overlap perfectly in the image space. Furthermore, the interference of the overlapping waves must yield fringes whose spatial frequencies correspond to the Fourier components of the irradiance of the object scaled by magnification. Further, the phases and the intensities of the fringes must correspond to the phases and intensities of the Fourier components of the irradiance of the object. These parameters must match the object in the following decreasing order of importance:

1) Overlap
2) Frequency
3) Phase
4) Intensity

According to the teachings of the present invention, the fringes are due to the interference of two beams, i.e. each wave is split and then recombined with itself to create sinusoidal fringes. The spatial frequencies of the fringes are determined by the angles between the interfering waves. The spatial frequency of the sinusoidal fringe corresponding to angle $\alpha$ in FIG. 6 is given by $2(\sin \alpha)/\lambda$. The waves emanating from the object travel at different angles. Therefore, each wave sets up a distinct fringe pattern with a different spatial frequency. The fringes must be free to move laterally to adjust the phases of the fringes to match those of the irradiation of the object.

In the Amplitude Splitting inverted shear interferometer of FIG. 6 there is a plane of zero optical path length difference, where the phase is zero, in the image space for each angle of incidence. The phase varies linearly in both directions perpendicular to the plane. The location of the plane of zero path length difference varies with the angle of incidence, but the phases of the sinusoidal fringes corresponding to different angles of incidence are related. Therefore, the sinusoidal fringes are not free to slide past each other arbitrarily to suit the phases of the irradiation of the object. Furthermore, the simple 4-mirror Mach-Zehnder configuration of FIG. 6 does not overlap the waves completely while maintaining angular sensitivity. For this reason the Amplitude Splitting inverted shear interferometer of FIG. 6 is combined with the two-curved mirror configuration of FIG. 5 to produce an imaging system. In fact mirrors $M_6$, $M_7$ and $M_{14}$ in FIG. 5 play the same roles as mirrors $M_{15}$, $M_{16}$ and $M_{17}$ in FIG. 6, respectively. The inverted shear configuration of FIG. 5 overlaps the waves completely while providing angular sensitivity, as shown in Examples 1 and 2 above.

According to Huygen's Principle, a wavefront at any point in time is represented by the envelope due to the superposition of an infinite number of spherical waves emanating from all points across the wavefront at an earlier time. Thus, the wavefront is created by the multiple interferences from an infinite number of point sources. The concept of wavefront is crucial in imaging. Constructing an image with a lens is a matter of recombining the waves that emanated from the object in the hope of recreating the same electric field distribution in the image plane that once existed on the object. However, a wavefront is very susceptible to atmospheric disturbances which alter the optical path, due to the multiple-beam interference, in the same manner that a Fabry-Perot interferometer is more susceptible to a dust particle in the optical path than a Michelson or a Mach-Zehnder interferometer. For this reason, Adaptive Optics systems aim at cancelling the effects of the atmosphere using deformable mirrors to restore the wavefront to its original shape. The current invention provides lower susceptibility to atmospheric disturbances by virtue of the two-beam interference. Lowering the order of interference, i.e. reducing the number of interfering waves reduces the susceptibility to atmospheric disturbances. In two-beam interferometers the wavefront is less important. A real image is created by superposing the fringes of two-beam interferences without reconstructing the original wavefront.

Spectral Imaging

Interferometry inherently depends on the wavelength of light. In fact, amplitude splitting interferometers, most notably Michelson's is used extensively for spectral imaging, which forms the basis of Fourier Transform spectroscopy (FTS). The algorithm used to extract spectral information is one of the simplest. It consists of taking the Fourier Transform of the output of the aligned single wavefront interferometer vs. mirror scan distance to yield the power spectrum of the incident radiation. Tilting of the split wavefronts to create spatial fringes, as shown in FIG. 6, permits spatial imaging. The algorithm for extraction of the spatial image is as simple as that of the spectral image. The phase of the fringes is adjusted by displacing one of the mirrors $M_{16}$ or $M_{17}$ parallel to itself. Two extreme cases have been studied in the analysis of the proposed concept, namely total coherence and total incoherence. The fringes can result from variations either in angle or wavelength. One point source emitting at two wavelengths can be confused for two quasi-monochromatic point sources emitting at the same average wavelength. The spectral resolution can be estimated from the angular resolution. For small angles the spatial frequency of the fringes $f_s$ depends on the ratio of angle to wavelength, $\theta/\lambda$. Thus, the wavelength resolution $\Delta\lambda$ is given by $\Delta\theta/f_s$, where $\Delta\theta$ is the angular resolution given by $\lambda/a$, where 'a' is the size of the aperture.

Example 3

An aperture of 1 meter provides an angular resolution of $5\times10^{-7}$ radian at a wavelength of 500 nanometers. The corresponding spectral resolution is $10^{-11}$ meter or 0.1 Angstrom for a fringe period of about 20 µm compatible with current CCD pixel fabrication technology. This could accommodate 100 channels per nanometer of bandwidth, which is adequate for multi-spectral and hyper-spectral imaging applications.

CONCLUSION

An important aspect of imaging systems is spatial and spectral resolution. It is desired to widen the aperture to improve the spatial resolution. A lens has the advantage that it performs the Fourier Transform optically and requires minimal signal processing. However, increasing the size of the lens beyond a certain limit is impractical and prohibitively expensive. A concept is provided for a full aperture imaging system utilizing planar reflective optics, which can be scaled to large apertures. The concept uses simple Fourier analysis and an algorithm to compute the angular or Fourier components of the irradiance distribution. The concept has the advantage that it produces an image in real space and does not require the fabrication or use of high quality optics. It is also more tolerant to atmospheric aberrations. The proposed concept can be used to image coherent as well as distant incoherent objects. It can be deployed on the ground as well as in space. It can be used in conjunction with active (laser) illumination, or passive (natural) illumination of objects. The proposed concept provides two-dimensional spatial imaging as well as spectral imaging. The concept has the potential to achieve high spatial and spectral resolution. The proposed technique is alternative to the pupil plane synthetic aperture technique.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed:
1. A method of imaging an object comprising:
Receiving electromagnetic radiation comprising wavefronts propagating at different angles,
Splitting the amplitudes of the wavefronts,
Interfering each wavefront with itself to create sinusoidal fringe patterns having different spatial frequencies,
Determining a phase for each of the fringe patterns having different spatial frequencies,
Superposing said fringe patterns to form a real image of the object without reconstructing the original wavefront.

* * * * *